US006453454B1

(12) United States Patent
Lee et al.

(10) Patent No.: US 6,453,454 B1
(45) Date of Patent: Sep. 17, 2002

(54) AUTOMATIC ENGINEERING CHANGE ORDER METHODOLOGY

(75) Inventors: Kuochun Lee, Fremont; Tsung-Yen Chen, Milpitas, both of CA (US)

(73) Assignee: Oridus Inc., Fremont, CA (US)

( * ) Notice: Subject to any disclaimer, the term of this patent is extended or adjusted under 35 U.S.C. 154(b) by 0 days.

(21) Appl. No.: 09/261,932

(22) Filed: Mar. 3, 1999

(51) Int. Cl.[7] .................................................. G06F 17/50
(52) U.S. Cl. ............................................ 716/11; 716/12
(58) Field of Search ............................ 716/11, 1, 8, 12

(56) References Cited

U.S. PATENT DOCUMENTS 5,953,236 A * 9/1999 Houssain ........................ 716/6
6,014,506 A * 1/2000 Houssain ...................... 716/11
6,031,981 A * 2/2000 Lee .............................. 716/10

* cited by examiner

*Primary Examiner*—John F. Niebling
*Assistant Examiner*—Stacy Whitmore
(74) *Attorney, Agent, or Firm*—Nguyen & Associates

(57) ABSTRACT

An automatic Engineering Change Order (ECO) methodology to effectively and efficiently carry out an ECO process is provided. In the present invention, an ECO framework, which includes a database and Computer Aided Design (CAD) software tools, is implemented as part of the ECO process. The ECO framework database is used in monitoring the gate array cells reserved for ECO modifications. In addition, the database also stores information related to the gate array cells such as their timing characterization, fanout characteristics, physical locations, and others. The database also includes library for storing selected connectivity patterns for logic cells. On the other hand, the ECO framework CAD software tools are used to place the reserved gate array cells in a physical layout and to monitor their status. The CAD software tools is also used to select gate array cells from the database for ECO changes according to predetermined criteria.

16 Claims, 4 Drawing Sheets

AUTOMATIC ENGINEERING CHANGE ORDER METHODOLOGY

This application is also related to U.S. Pat. No. 6,260,177 filed on May 15, 1998 and issued on Jul. 10, 2001 for "AUTOMATIC CONFIGURATION OF GATE ARRAY CELLS USING A STANDARD CELL FUNCTION LIBRARY."

This application is also related to U.S. patent application having Ser. No. 09/079,946, filed on May 15, 1998 for "AUTOMATIC CONFIGURATION OF GATE ARRAY CELLS USING A STANDARD CELL FUNCTION LIBRARY".

FIELD OF THE INVENTION

The invention generally relates to computer-aided design techniques for large-scale integrated circuits, and more particularly relates to configuring gate array cells for Engineering Change Order (ECO).

BACKGROUND OF THE INVENTION

Rapid advances of very large-scale integrated circuit (VLSI) technologies have made design of integrated circuits increasingly complex. Computer-Aided Design (CAD) has become a necessity to speed up and improve the quality of VLSI design. In designing a VLSI circuit, logic design engineers typically implement the VLSI circuit in a Hardware Description Language (HDL) specification using a high-level CAD software such as Very High Speed Integrated Circuit (VHSIC) Hardware Description Language (VHDL), Verilog, etc. Alternatively, the VLSI circuit may be implemented by schematic design. Next, the HDL. specification is synthesized into a netlist which is essentially a data file consisting of all the logic gates required for the VLSI circuit. Such synthesis is typically carried out using a CAD compiler such as those from Synopsys Corporation of San Jose, Calif. The above steps make up the logic design phase.

Using the synthesized netlist, a computer layout of the VLSI circuit can be created. Generally, the computer layout is created by arranging a number of individual blocks or "logic cells" according to predetermined schematics. The functionality and design of individual logic cells may be predetermined and stored on a computer system as a standardized design. Such design techniques can save considerable time, as it is no longer necessary for an integrated circuit designer to custom design each individual gate and transistor in an integrated circuit. Rather, the circuit designer breaks down a new circuit design into a number of known (or new) cell designs and then combines these cells together to generate a circuit design, which performs a desired function. Each of the logic cells contains a number of terminals for implementing into the integrated circuit. These logic cells are commercially available.

Commercial "place-and-route" CAD tools, such as Cell3™ or Silicon Ensemble™ from Cadence Design Systems, Inc., of San Jose, Calif., are then utilized to generate the physical layout of the VLSI circuit. More particularly, place-and-route CAD programs are used 1) to arrange logic cells and other elements to optimize their interconnections and the overall surface area and 2) to define the routing region and to select channels to connect the logic cells and elements. To perform the tasks mentioned above, a place-and-route CAD tool requires as input a predetermined number (including reserves) of predefined logic cell types (e.g., AND-gate, OR-gate, flip-flop, etc.). Information related to the logic cells along with the required terminal connections are provided to the place-and-route CAD tool in the netlist which can be preserved and updated at subsequent times as needed to reflect changes. In response, the place-and-route CAD tool outputs a physical layout.

Using the computer layout generated as a blueprint, a number of base, contact, and metal layers defining the elements and interconnections of the VLSI circuit are created in silicon through a combination of semiconductor processes namely depositing, masking, and etching. When combined, these layers form the VLSI circuit. Depending on the complexity of the application specific VLSI circuit, each circuit may involve multiple base layers, multiple contact, and multiple metal layers. The above steps make up the physical design phase.

Following the generation of a physical layout, for various reasons including design changes, modifications are subsequently required to delete as well as add logic elements and interconnections from the VLSI circuit. When this occurs, an engineering change order (ECO) is generated to document the desired changes. To implement these ECO changes, extra logic cells of different types are incorporated in the original netlist as reserves. Under one conventional ECO methodology, the desired changes are incorporated by manually selecting spared logic cells and making the necessary connections to these selected spared cells to provide the desired logic functions. Such a conventional manual ECO methodology is therefore carried out entirely during the physical design phase. Given the increasing complexity of VLSI circuits, the existing obstacles, and the space constraints in the layout, this manual ECO methodology involves painful and time consuming task to identify the extra logic cells and provide the proper wiring to properly connect the added cells. As a result, the turn-around time to incorporate the desired ECO changes is generally high.

Under another conventional ECO methodology, the ECO changes are automatically incorporated entirely during the logic design phase. More particularly, an ECO compiler is used for implementation of ECO's. The ECO compiler compares the logic designer's new HDL specification (i.e., with the desired ECO changes) to the old HDL specification to determine the extent of logical change. The ECO compiler then changes the original synthesized netlist as required to conform to the new HDL specification. The modified netlist inherits has much of the original netlist as possible including cell instance and net names. The modified netlist is then transferred to the physical design environment in which incremental place and route is performed. The main tasks in this conventional ECO methodology involve equivalence checking to identify equivalent logic regions for reuse, ECO synthesis to maximally reuse old logic during resynthesis, and spare cell mapping to map new logic functions onto reserved spare standard cells.

While this conventional automatic ECO methodology generally improves the time to market compared to the manual ECO methodology discussed above, it suffers from inflexibility as a limitation. Under this conventional automatic ECO methodology, reserved/spare standard logic cells of different and predefined types are already included as reserves when the original netlist is synthesized in case ECO changes are required subsequently. Additionally, due to limitations inherent in the software environment (e.g., capability to handle a limited number of variables), the place-and-route CAD tool requires that these extra logic cells be of predefined types and numbers. Because the types of the logic cells are predefined as AND gates, OR gates, flip-flops, etc., modifications are limited to changing the logic cells connectivity. Such inflexibility may cause disastrous consequences. For example, in adding logic elements as required under an ECO, a logic cell of a certain type may not be available for implementing a desired function. As a result, either the desired function must be deleted or the process of generating a new computer layout with the desired logic cells must be restarted thereby resulting in the rejection of the VLSI silicon manufactured. These options are not desirable for reasons including delays, costs, and others. Moreover, it may not be possible to meet the ECO performance requirements because the performance of the reserved standard logic cells becomes fixed at the time they are selected and implemented. Furthermore, because synthesized designs are very optimized in terms of gate use, it is difficult to trace the gate level netlist and/or to locate spare logic cells after synthesis which may result in a time-to-market delay.

As semiconductor processing technology advances into deep sub-microns territory (e.g., 0.25$\mu$, 0.18$\mu$, and smaller), logic cells are packed into increasingly tighter space. Accordingly, there is less space available to reserve logic cells for ECO purposes. For this reason, it is more important than ever to conserve and more fully utilize all the spare logic cells reserved for ECO. Failing to do so, more silicon rejections and consequently more tape-outs are likely to result, which may lead to inefficiency, delays, and increased costs. Moreover, it is desirable that the netlist be easily traced and spare logic cells be easily located for ECO purposes to reduce the time to market. Furthermore as semiconductor performance continues to break new barriers, it is equally important to ensure that performance requirements are met when ECO changes are implemented.

Thus, a need exists for an automatic method and system to effectively and efficiently carry out an ECO process that can ensure that performance requirements are met when ECO changes are implemented.

SUMMARY OF THE INVENTION

Accordingly, the present invention provides a method and a system to effectively and efficiently carry out an ECO process that can ensure that performance requirements are met when ECO changes are implemented.

The automatic ECO methodology of the present invention involves implementing an ECO framework that includes at least a database for storing and monitoring information related to configurable gate array cells reserved for ECO modifications in the database. The database may also stores logic cell connectivity patterns for use to configure the configurable gate array cells reserved for ECO modifications. The database is also used in adding and placing the configurable gate array cells in the physical layout. In-response to information from an ECO netlist, at least one reserved gate array cell is selected for implementing the ECO modifications. After new metal layers for the physical layout of the design integrated circuit are generated, the at least one reserved gate array cell is configured to provide the ECO changes. The information stored in the database is updated to reflect changes in the configurable gate array cells reserved for ECO modifications.

The information stored in the database includes timing characterization, physical locations, and fanout characteristics. Accordingly, gate array cells reserved for implementing the ECO modifications can be selected based on timing characterization, ease of connectivity, and/or propagation characteristics. The information stored in the database can be made available to the ECO compiler thereby automating the entire ECO process.

All the features and advantages of the present invention will become apparent from the following detailed description of its preferred embodiment whose description should be taken in conjunction with the accompanying drawings.

DETAILED DESCRIPTION OF THE INVENTION

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

The automatic Engineering Change Order (ECO) methodology in the present invention utilizes an ECO framework that includes at least a database for storing information related to the spare gate array cells reserved for implementing ECO changes. The stored information includes reserved configurable gate array cell identifications, cell modeling information (i.e., net connectivity patterns), timing characterization information, and gate array layout (physical location) information. Other stored information includes fanout information, electrical information, and other characterization information of the spare gate array cells. The information is updated whenever any ECO changes are to be implemented. In so doing, the spare gate array cells can easily be monitored and the most optimum gate array cells in terms of timing, desirable propagation characteristics, ease of connectivity, etc can be selected for ECO changes. In addition, the modeling information and timing characterization information, which are programmable, can be used to automatically configure selected spare logic cells and to ensure that performance requirements are met. The information can also be provided to an ECO compiler as needed to generate an ECO netlist. In so doing, the ECO process can be automatically carried out by computers thereby reducing the turn-around time. In accordance to the present invention, the reserved configurable gate array cells are included when the physical layout of the VLSI circuit is being generated. By using spare configurable gate array cells instead of standard cells and incorporating them at the physical layout stage, more flexibility is provided to accommodate a wider range of ECO changes.

Figure 1:
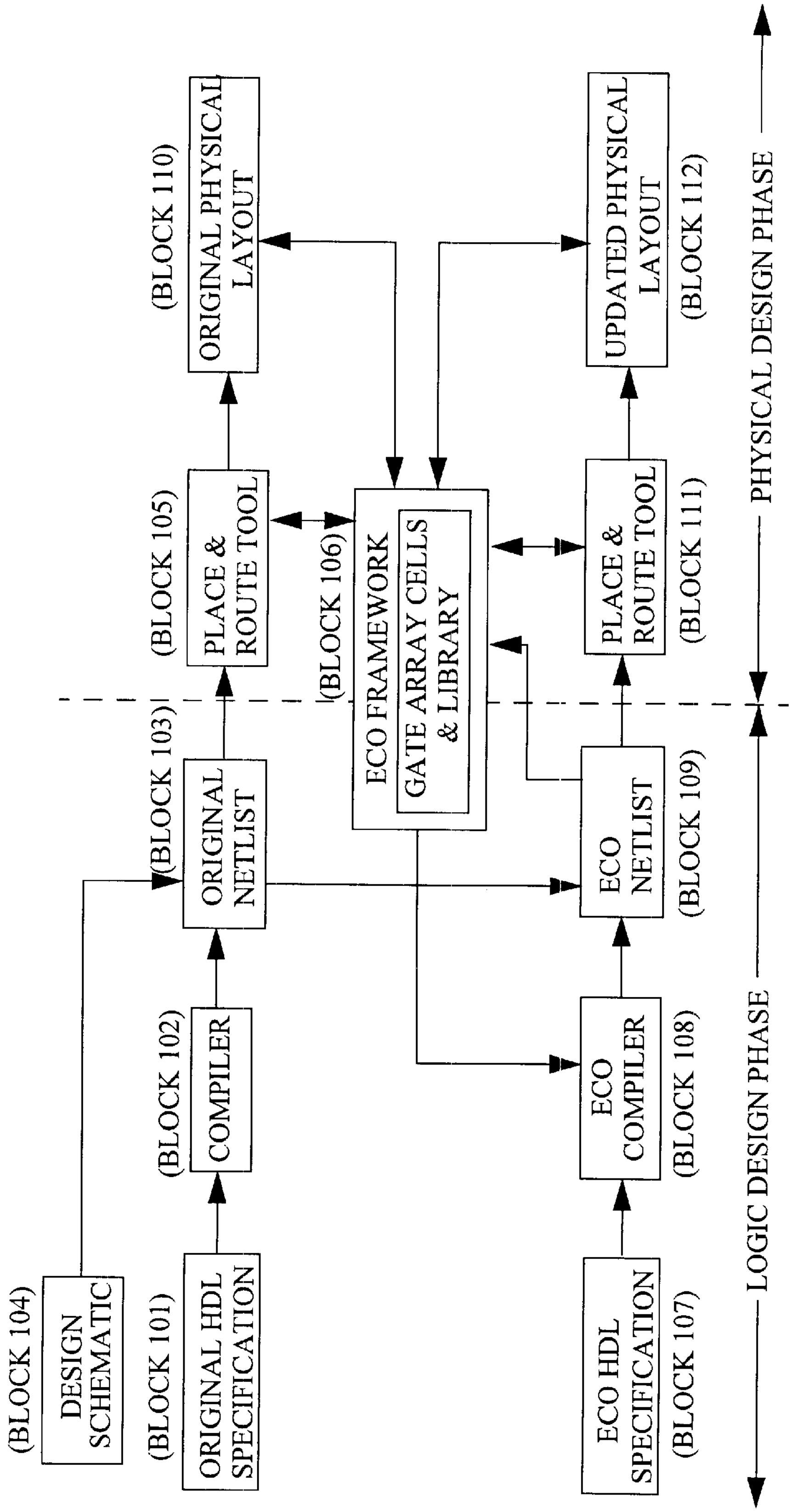
FIGS. 1 is a diagram of an overall view of the automatic ECO methodology of the present invention.

Reference is made to FIG. 1 illustrating an overall view of the automatic ECO methodology of the present invention. As shown in FIG. 1, at the beginning of the logic design phase of a VLSI circuit, a High Description Language (HDL) specification of the VLSI circuit is generated (block 101). This HDL specification is then provided to a compiler for synthesis (block 102). As a result, an original netlist is synthesized (block 103). Alternately, the original netlist can also be generated using a design schematic of the VLSI circuit (block 104). The original netlist is then provided to a place & route Computer Aided Design (CAD) tool (block 105) to generate an original physical layout (block 110). In accordance to the present invention, an ECO frame work (block 106) is utilized to assist the place & route tool in incorporating reserved gate array cells into the original physical layout for ECO implementations. The ECO frame work includes CAD software tools that are used to place the reserved gate array cells for ECO changes during the generation of a physical layout and to update as well as monitor their status (e.g., availability, etc). The CAD software tools are also used to select gate array cells for ECO modification according to predetermined criteria. More particularly, the ECO frame work includes a database and library for storing information related to the spare gate array cells used in the physical layout such as their timing characterization, net connectivity patterns, physical locations, fanout information, electrical characteristics, and others. In selecting spare gate array cells for implementing ECO changes, timing characterization information is used to ensure that the performance requirements are satisfied. Fanout information is used to select the spare gate array cells with the most optimum propagation characteristics. Physical location information is used to monitor and track the reserved gate array cells thereby ensuring ease of connectivity. Information related to the net connectivity patterns (i.e., modeling information) is used to automatically and effectively configure logic cells (through the use of computers) to implement logic functions (e.g., ANDing, ORing, etc.).

When ECO changes are to be implemented, a HDL specification of the required ECO changes is generated (block 107). The ECO HDL specification is provided to an ECO compiler (block 108) for synthesis. In response, the ECO compiler synthesizes an ECO netlist (block 109). The logic functions required by such ECO netlist are communicated to the CAD software tools of the ECO framework. Because the ECO framework involves CAD software tools, it can be adapted to interface with the ECO compiler. The CAD software tools then go through the stored information in the ECO framework database and library to select the most suitable (i.e., performance, ease of connectivity, desirable propagation characteristics, etc.) gate array cells to implement the required ECO changes. The ECO netlist is merged with the original netlist to combine the ECO logic functions with the original logic functions. The merged netlist is then provided to the place & route CAD tool (block 111) to update the physical layout which also includes inputs from the ECO framework CAD software tools (block 112). In accordance to the present invention, except for the metal layer(s), the updated physical layout retains essentially all of the original physical layout's base layers. The new metal layer(s) includes connections that must be made to the selected spared gate array cells to implement the required ECO changes. As demonstrated by FIG. 1, the ECO framework is an integral part of the automatic ECO methodology in accordance to the present invention. Because the ECO framework is utilized during both the logic design phase and the physical design phase, it affords the ECO process flexibility while allowing the ECO process to be automated thereby reducing the time-to-market time.

Figure 2:
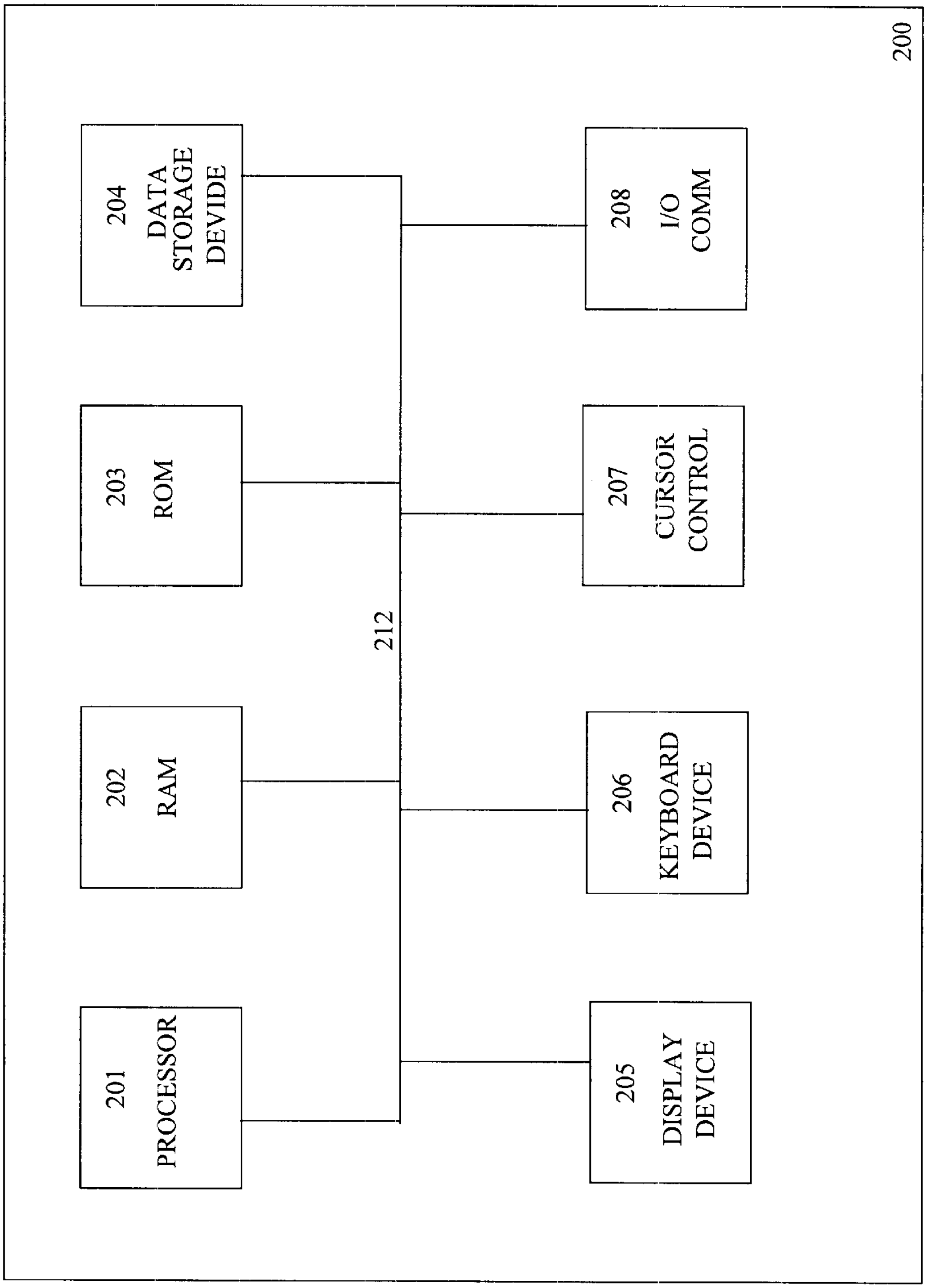
FIG. 2 is a block diagram illustrating a computer system that implements the ECO framework in accordance with the present invention.

Reference is made to FIG. 2 illustrating a block diagram of computer system 200 upon which the present invention may be implemented or practiced. It is to be appreciated that computer system 212 is exemplary only and that the present invention can operate within a number of different computer systems including general-purpose computers systems, embedded computer systems, and computer systems specially adapted for electronic design automation. In the following discussions of the present invention, certain processes and steps that are realized as a series of instructions (e.g., software program) that reside within computer readable memory units of system 200 and executed by processors of system 200.

In general, computer system 200 used by the present invention comprises address/data bus 212 for conveying information and instructions, one or more processors 201 coupled with bus 212 for processing information and instructions, a random access memory (RAM) 202 for storing digital information and instructions, a read only memory (ROM) 203 for storing information and instructions of a more permanent nature. In addition, computer system 200 may also include a data storage device 204 (e.g., a magnetic, optical, floppy, or tape drive) for storing vast amounts of data, and an I/O interface 208 for interfacing with peripheral devices (e.g., computer network, modem, etc.). Moreover, computer system 200 may include a display device 205 for displaying information to a computer user, an alphanumeric input device 206 (e.g., keyboard), and a cursor control device 207 (e.g., mouse, trackball, lightpen, etc.) for communicating user input information and command selections.

In accordance to the present invention, the ECO framework which includes the CAD software tools and the database are implemented in the random access memory (RAM) of system 200. The reserved gate array cells, information related to the reserved gate array cells, and logic cell library information are stored in the database. As discussed earlier, information stored in the ECO framework database is made available to the ECO compiler for synthesizing an ECO netlist and contributes to the generation of the physical layouts (i.e., original physical layout and updated physical layout). The database is updated to reflect the information in the original physical layout and the updated physical layout. In the preferred embodiment, the gate array cell database monitors the number of spare gate array cells available for ECO modifications. The gate array cell database in accordance to the present invention further stores other information related to the gate array cells available. Preferably, these information includes physical locations, timing information and fanout characteristics and are linked to the gate array cells through the use of pointers. Obviously, other types of information may also be added to the database. It is noted that as gate array cells are added or used up in ECO modifications, the gate array cell database is updated accordingly. The implementation of such database should be clear to a person of ordinary skill in the art. For this reason, the specific implementation of this database is not further discussed.

The CAD software tools in the ECO framework are used to place the spare gate array cells at desired locations throughout the physical layout for ECO changes. The CAD software tools are used to determine whether there is any ECO changes to be made by comparing the original netlist against a merged netlist which includes ECO changes. The CAD software tools are also used to select spare gate array cells to implement ECO changes. In selecting spare gate array cells to implement ECO changes, the CAD software tools examines the related information in the database to make sure that the spare gate array cells selected meet the required timing characterization, the connectivity requirement, the propagation characteristics, and/or others. The CAD software tools are further used to configure the selected gate array cells to perform desired logic functions using the connectivity patterns stored in the ECO framework library. Such library allows any connectivity patterns to be stored thereby allowing computerized and customized configuration of spare gate array cells to be made to provide the desired logic functions. In addition, the CAD software tools are used to update information stored in the database. How to implement the described CAD software tools of the ECO framework library should be clear to a person of ordinary skill in the art. For this reason, the specific implementation of these CAD software tools is not further discussed.

Figure 3:
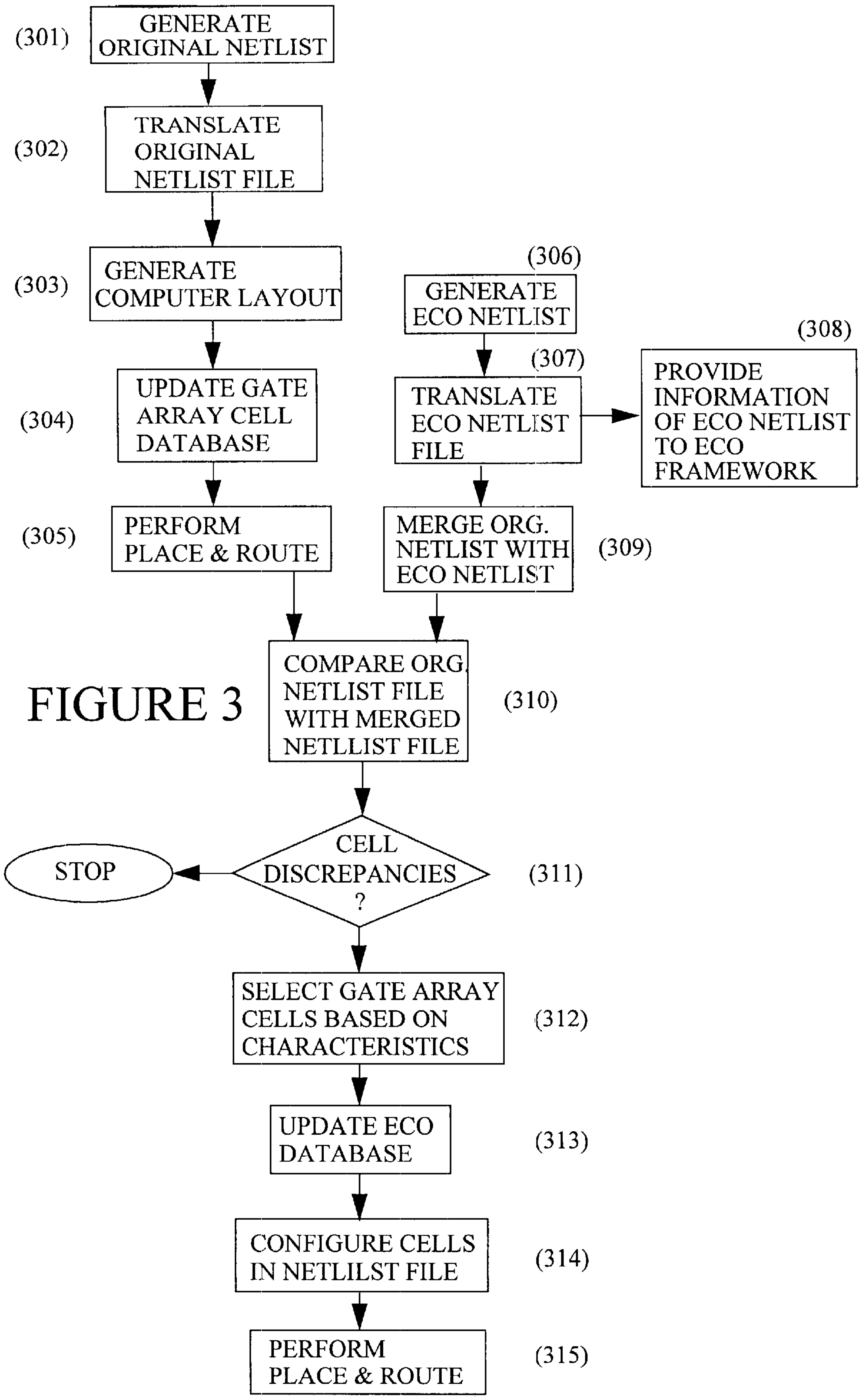
FIG. 3 is a flow chart illustrating the high-level steps of the automatic ECO methodology in accordance with the present invention.

FIG. 3 is a flow chart illustrating the high-level steps involved in the automatic ECO methodology in accordance with the present invention. More detailed description of some of these steps are provided in the descriptions of subsequent figures below. In step 301, an original netlist data file is generated. As discussed earlier, such an original netlist data file can be generated from either a HDL specification using a compiler or directly from a design schematic. At this point, the netlist data file contains a description of sets of terminals that must be interconnected. The netlist data file is then formatted/translated to work with the place-and-route CAD tool selected (step 302). Preferably, the net list data file is formatted to the design exchange format (DEF) for place-and-route CAD tool Cell3™, a maze-based router, from Cadence Design Systems, Inc., of San Jose, Calif. Next, through user interaction, power pads, ground pads, cornercells, gap cells, and configurable gate array cells (e.g., for ECO modifications) are added using the CAD software tools of the ECO framework to the formatted original netlist in step 303. In doing so, a layout of the VLSI circuit is created. At this point, information related to the reserved configurable gate array cells added (e.g., their identification, their timing characterization, physical locations, fanout characteristics, etc.) are input in the ECO framework database (step 304).

Using the formatted netlist as input, place-and-route CAD tool Cell3™ is used to determine the routing, placing, wiring, interconnections and general layout of the VLSI circuit (step 305). In general, connections between gate array cells and other standard cells are made by place-and-route CAD tool Cell3™ according to the description provided in the original netlist file. All these information are then saved as part of the formatted netlist file. It is to be appreciated that the gate array cells used in the present invention are basically floating transistors that can be manually derived from standard commercial logic cells by modifying the existing connections. The floating transistors of these modified standard logic cells can then be configured to provide any desired function by making the appropriate connections in the corresponding metal layer.

In response to an ECO, the desired changes (e.g., terminal connections) are compiled (using an ECO compiler) in an ECO netlist file that also contains descriptions of sets of terminal connections to be made (step 306). In accordance to the present invention, the names describing the components (e.g., gate array cells, standard cells, and others), the terminal connections, and others in the original netlist file are preserved throughout any subsequent ECO modifications. In addition, the names used to describe the new components, connections, etc. in the ECO netlist file should be selected so that all the names are distinct relative to each other. In so doing, the components, terminal connections, and others can be more easily monitored for implementing ECO changes.

The ECO netlist file is also formatted for place-and-route CAD tool Cell3™ (step 307). The desired changes in the ECO netlist file is communicated (step 308) to the ECO framework so that the ECO framework can select. the most optimum spare gate array cells for implementing the ECO changes. The original netlist file is merged with the ECO netlist file (step 309). The original netlist file is then compared against the merged netlist file to determine the changes to be made (step 310). More particularly, the CAD software tools of the ECO framework determine whether there are any cell discrepancy between the original netlist file and the merged netlist file (step 311). If any cell discrepancy is detected indicating modifications are required, gate array cells are selected for reconfiguration to provide the desired functionality (e.g., as ANDing, an ORing, etc.) (step 312). Gate array cells are selected based on criteria such as their timing characterization, physical location, fanout characteristics, etc. As an example, the gate array cells selected for an ECO modification should meet the timing requirement for the desired ECO function change. Moreover, the gate array cells selected should be located within a desired range to minimize the amount of connection. Furthermore, the gate array cells selected should have fanout characteristics such that undesired signal propagation to other cells is prevented.

Upon selecting the gate array cells for ECO modification, the ECO framework database is updated to show the gate array cells utilized and those that are still available (step 313). Next, using the logic cell connectivity patterns (cell models) stored in the cell library that is a part of the ECO framework database, the wiring in the corresponding metal layer is modified to reconfigure the selected gate array cells to provide the desired functionality (e.g., as ANDing, an ORing, etc.) (step 314). The base layers previously generated as part of the physical layout are therefore preserved. The merged netlist file is provided as input to place-and-route CAD tool Cell3™ to determine the new routing, placing, wiring, interconnections and general layout of the VLSI circuit (step 315). Place-and-route CAD tool Cell3™ then outputs a new physical layout of the VLSI circuit. Hence, most of the information generated from the previous layout is saved and reused. In the unlikely event that no cell discrepancy is detected, no modification is required in the original netlist file.

Figure 4:
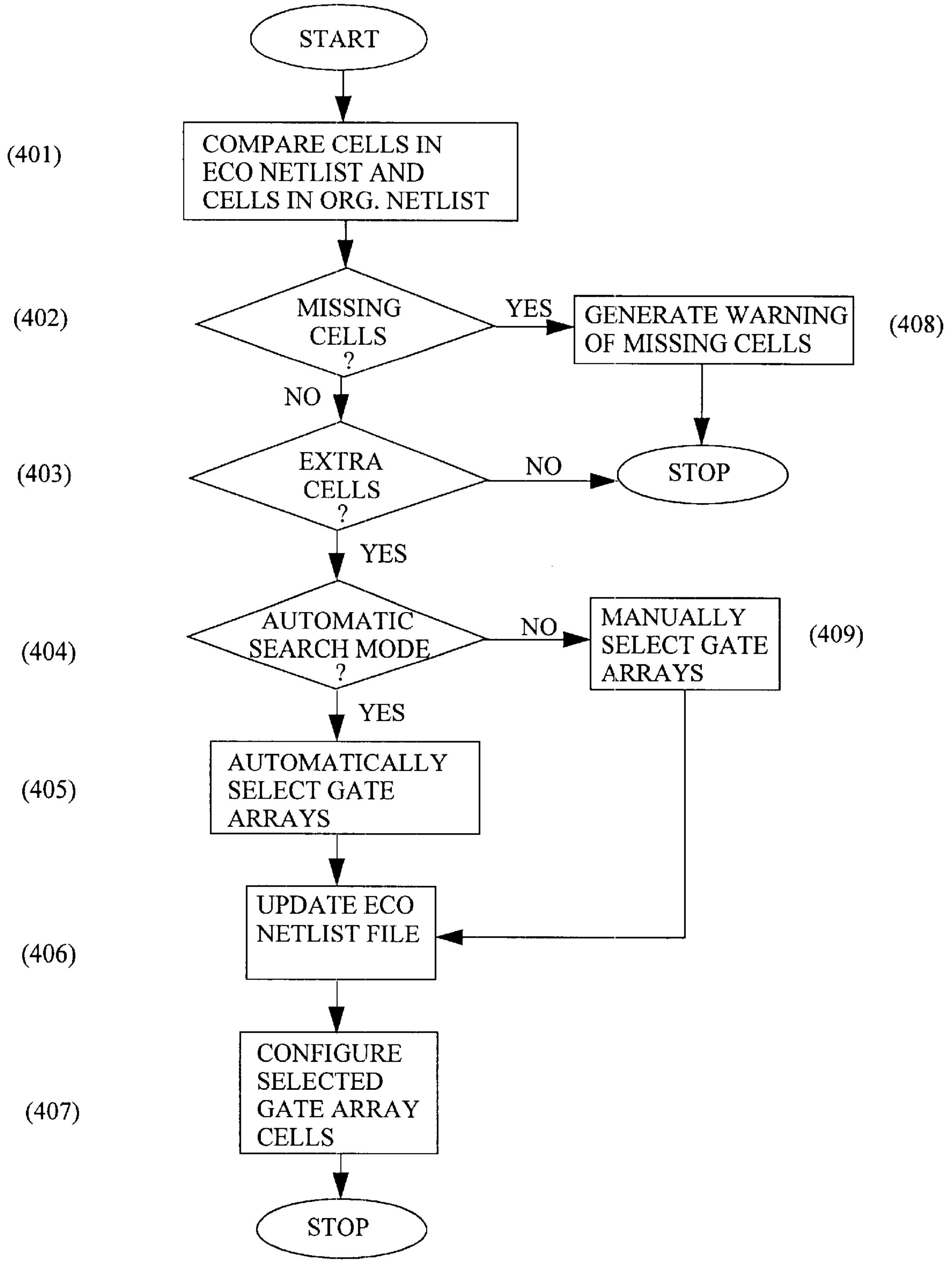
FIG. 4 is a flow chart illustrating in more detail steps 310–313 of FIG. 3.

Referring now to FIG. 4 illustrating a flow chart of the instruction codes stored in memory of computer system 200 which when executed by processor 201 helps to determine whether or not there are any cell discrepancies between the original netlist file and the merged netlist file and to reconfigure the gate array cells as needed to incorporate the desired ECO changes (steps 310–313 of FIG. 3). These instruction codes are a part of the CAD software tools that are part of the ECO framework in accordance with the present invention. In step 401, the merged netlist file is compared against the original netlist file. In particular, the sets of terminal connections from the merged netlist file are compared against that of the original netlist file. The terminal connection differences may indicate whether there are gate array cells missing in the merged netlist file or whether there are extra gate array cells in the merged netlist file. More specifically, the merged netlist file is missing cells when the original netlist file utilizes the cells but the merged netlist file does not. On the other hand, the merged netlist file contains some extra cells when the it utilizes the cells but the original netlist file does not.

If it is determined that there are some missing cells (step 402), a warning is generated to the user (step 408). When there are some missing cells, some cells have probably been deleted inadvertently and the user needs to double check. If there are no missing cells, it is determined whether the merged netlist file contains some extra cells (step 403). In the unlikely event that the ECO netlist file also does not contain any extra cells, there is either no cell discrepancies or the ECO modifications only involve connectivity change. When this occurs, the CAD software tools are stopped. On the other hand, if it is determined that the merged netlist file contains some extra cells, steps are taken to reconfigure selected spare gate array cells to provide the desired logic functions. This is because a determination of extra cells indicates that additional logic functions are required to be implemented by the ECO. The extra cells detected and their desired functionality are compiled into a list, which is monitored to ensure that the required reconfigurations are carried out.

To help select the most ideal gate array cells to reconfigure, both an automatic search mode and a manual search mode are allowed by the CAD software tools of the ECO framework. As discussed earlier, gate array cells can be reconfigured by modifying the net connections in the metal layers. As such, in accordance to the present invention, one of the criteria used for the search algorithm employed in the automatic search mode is based on the gate array cell timing characterization. As an example, assuming the ECO requires an AND gate with a certain timing characteristic to be implemented, only gate array cells having a timing characteristic below a certain level may be selected. Another search criteria used in accordance to the present invention is fanout characteristics. Because a gate array cell may be connected to other cells, which may result in signals propagating to these cells, only gate array cells with certain fanout propagation characteristics may be selected. Yet another search criteria is ease of connectivity. The CAD software tools may be designed to select gate array cells that provide the optimum connectivity (e.g., the shortest amount of wiring, the least number obstacles, etc.). It should be clear to a person of ordinary skill in the art that other search criteria can be used in the search algorithm employed in the search mode. At times, however, limitations may render an automate search inefficient in locating ideal gate array cells for reconfiguration. The manual select mode is provided to allow user to visually select gate array cells.

As such, in step 404, the program determines whether the user selects the automatic or the manual search mode. The user selection is provided interactively to computer system 200. If the automatic search mode is selected, the search engine scans the database to look for gate array cells that meet the search criteria discussed above (step 405). In the automatic search mode, information regarding the type of gate array cells (e.g., a flip-flop, an AND gate, etc.) to be implemented is automatically provided by monitoring the list storing the extra cells and their desired functionality. On the other hand, if the manual search mode is selected, the user manually selects the desired select gate array cells by drawing a box to surround these cells (step 409). The user is then required to provide as input the type of cell to be implemented. In response, a dialog window pops up to ask the user to confirm the type of cell (e.g., a flip-flop, an AND gate, etc.). Upon selecting the gate array cells to be reconfigured, whether through the automatic or manual search mode, the ECO framework database is updated (step 406).

Next, the gate array cells selected are reconfigured to change their functionality by modifying the net wiring pattern for the gate array cells selected. Such configuration is modeled after the connectivity patterns (cell models) that are stored in the ECO framework cell library. The ECO netlist file which contains the wiring instructions for the reconfigured gate array cells is later provided to the place-and-route CAD tool for reconfiguring the metal layers (step 407). The original netlist file is then updated and merged with the ECO netlist file (steps 307–309).

As an illustration of how selected gate array cells are reconfigured, consider the following example which assumes that the ECO requires an additional flip-flop be implemented. Assume also that three gate array cells are required to make up a flip-flop. After three adjacent gate array cells (GATE_P_1, GATE_P_2, GATE_P_3) are selected, either by automatic search or manual search, the coordinate location of cell GATE_P_1 is recorded as the coordinate location of the flip-flop X_FL02 (i.e., gate array cells reconfigured to have the same functionality as a standard flip-flop cell FL02) to be created. The three gate array cells are deleted from the original netlist file and replaced with flip-flop X_FL02. Furthermore, the three gate array cells and their associated characteristics are deleted from the gate array cell database. The ECO netlist file is merged with the original netlist file and the merged file is provided to the place-and-route CAD tool.

The preferred embodiment of the present invention, an automatic method and system to effectively and efficiently carry out an ECO process that can ensure that performance requirements are met when ECO changes are implemented, is thus described. While the present invention has been described in particular embodiments, the present invention should not be construed as limited by such embodiments, but rather construed according to the below claims.

What is claimed is:

1. A method to automatically carry out engineering change order (ECO) changes comprising:

storing and monitoring information related to configurable gate array cells reserved for ECO modifications in a database combined with at least CAD software tools to form an ECO framework that is utilized in both a logic design phase and a physical design phase;

generating an original netlist for a design integrated circuit;

generating a physical layout of the design integrated circuit using the original netlist, the physical layout having metal layers and base layers;

adding the configurable gate array cells in the physical layout;

generating an ECO netlist having information related to the ECO modifications to be implemented in design integrated circuit;

using the ECO netlist information to select at least one gate array cell reserved for implementing the ECO modifications;

generating new metal layers for the physical layout of the design integrated circuit;

configuring the at least one gate array cell to provide the ECO changes; and updating the information stored in the database to reflect changes in the configurable gate array cells reserved for ECO modifications.

2. The method of claim 1 further comprising the step of storing logic cell connectivity patterns for used in configuring the configurable gate array cells reserved for ECO modifications in the database.

3. The method of claim 2, wherein the information related to the configurable gate array cells includes timing characterization.

4. The method of claim 3, wherein the information related to the configurable gate array cells includes physical locations.

5. The method of claim 4, wherein the information related to the configurable gate array cells further includes fanout characteristics.

6. The method of claim 5, wherein the at least one gate array cell reserved for implementing the ECO modifications is selected based on timing characterization, ease of connectivity, or propagation characteristics.

7. The method of claim 1, wherein an ECO compiler is used in generating the ECO netlist.

8. The method of claim 7, wherein the information stored in the database is made available to the ECO compiler.

9. The method of claim 8, wherein the CAD software tools are used in adding the configurable gate array cells in the physical layout, selecting the at least one gate array cell reserved for implementing the ECO modifications, configuring the at least once gate array cell to provide the ECO modifications, and updating the information stored in the database.

10. A computer system adapted to automatically carry out engineering order (ECO) modifications, the computer system comprising:

a bus;

a central processor connected to the bus, and memory connected to the bus, the memory implementing a database for monitoring configurable gate array cells reserved for ECO modifications, the database storing information related to the reserved configurable gate array cells, the memory further storing instruction codes composing CAD software tools, the instruction codes when executed by the central processor interact with the database to place the configurable gate array cells in a physical layout, to select at least one gate array cell reserved for implementing the ECO modifications using information from a ECO netlist, to configure the at least one gate array cell to provide the ECO modifications, and to update the information stored in the data base to reflect changes in the configurable gate array cells reserved for ECO modifications, the CAD software tools are therefore utilized in both a logic design phase and a physical design phase, the database combining with at least the CAD software tools to form an ECO framework that is utilized in both a logic design phase and a physical design phase.

11. The computer system in claim 10, wherein the database further storing logic cell connectivity patterns for used in configuring the configurable gate array cells reserved for ECO modifications in the database.

12. The computer system in claim 11, wherein the information related to the configurable gate array cells includes timing characterization.

13. The computer system of claim 12, wherein the information related to the configurable gate array cells includes physical locations.

14. The computer system of claim 13, wherein the information related to the configurable gate array cells further includes fanout characteristics.

15. The computer system in claim 14, wherein the at least one gate array cell reserved for implementing the ECO modifications is selected based on timing characterization, ease of connectivity, or propagation characteristics.

16. The computer system of claim 11, wherein the information stored in the database is made available to an ECO compiler in generating an ECO netlist.

* * * * *